United States Patent [19]

Fink et al.

[11] Patent Number: 4,954,711

[45] Date of Patent: Sep. 4, 1990

[54] LOW-VOLTAGE SOURCE FOR NARROW ELECTRON/ION BEAMS

[75] Inventors: Hans-Werner Fink, Gattikon, Switzerland; Roger Morin, Marseilles, France; Heinz Schmid, Oberrieden, Switzerland; Werner Stocker, Wadenswil, Switzerland

[73] Assignee: International Business Machines Corporation, Armonk, N.Y.

[21] Appl. No.: 427,651

[22] Filed: Oct. 27, 1989

[30] Foreign Application Priority Data

Nov. 1, 1988 [EP] European Pat. Off. ............ 88810742

[51] Int. Cl.$^5$ ...................... H01J 37/073; H01J 37/08
[52] U.S. Cl. ............................. 250/423 R; 250/423 F; 250/310; 313/336; 313/360.1; 313/363.1; 313/230; 315/111.81
[58] Field of Search ................... 250/423 R, 423 F; 313/360.1, 363.1, 336, 230; 315/111.81

[56] References Cited

U.S. PATENT DOCUMENTS

| | | | |
|---|---|---|---|
| 3,814,975 | 6/1974 | Wolfe et al. | 313/336 |
| 3,959,651 | 5/1976 | Welter | 250/310 |
| 4,020,387 | 4/1977 | Coates et al. | 313/336 |
| 4,427,886 | 1/1984 | Martin et al. | 313/336 |
| 4,591,754 | 5/1986 | Hagiwara et al. | 313/336 |
| 4,721,878 | 1/1988 | Hagiwara et al. | 313/336 |
| 4,740,705 | 4/1988 | Crewe | 250/423 F |

OTHER PUBLICATIONS

"Point Source for Ions and Electrons", Physica Scripta, vol. 38, (1988), pp. 260–263, H–W. Fink.

Primary Examiner—Jack I. Berman
Assistant Examiner—Kiet T. Nguyen
Attorney, Agent, or Firm—John J. Goodwin

[57] ABSTRACT

This source for charged particles comprises a sharply pointed tip (1) and an aperture (2) in a thin sheet of material. If the point of the tip (1) is made sharp enough, i.e., if it ends in a single atom or a trimer of atoms, the electric field existing between the tip (1) and the aperture (2) will cause a stream of electrons to be emitted from the tip (1), pass the aperture (2) and to continue as a beam (4) of free electrons beyond said aperture (2). The sheet (3) carrying the aperture (2) may, for example, be a carbon foil or a metallic foil, including gold. The distance of the tip (1) from the aperture (2) is in the submicron range, and so is the diameter of said aperture (2). The distance is being held essentially constant by means of a feedback loop system. The divergence of the beam (4) is <2°. If the source is operated in an ultra-high vacuum, the particle beam (4) will consist of free electrons, whereas, if the source is operated in a noble-gas atmosphere, the beam (4) will consist of noble-gas ions. Both, the electron beam, as well as the ion beam, contains particles of a very low frequency.

8 Claims, 1 Drawing Sheet

LOW-VOLTAGE SOURCE FOR NARROW ELECTRON/ION BEAMS

DESCRIPTION

This invention relates to a source for very narrow beams of charged particles, such as electrons or ions, the source being capable of low-voltage operation. The invention is intended for application in ion and electron microscopy, interferometry, and lithography, for example.

Sources for electron beams have long been known in the art. They either rely on thermionic emission from a cathode that is heated to an elevated temperature to permit the electrons to acquire enough energy to escape from the surface of the cathode, or on the application of a very high electric field in the neighborhood of the cathode that acts to lower the potential barrier at the surface of the cathode so that the effective work function is sufficiently reduced. Prior art electron beam sources of these types are described in V. E. Cosslett, Introduction to Electron Optics, Oxford 1950.

The disadvantages of the prior art sources are a very low efficiency, rather large divergence of the beams produced, paired with the difficulty to focus those beams to a reasonably small spot, and, above all, the high energy of the electrons in such beams. All efforts to reduce the diameter of the electron beams go along with a consequential increase in energy of the electrons. Beams with high energy have the disadvantages of causing damage to the sample being investigated, and of penetrating too far down into the sample and, thus, providing information from an undesired large volume of the sample rather than from the sample's surface only.

One way to overcome these disadvantages is the use of a point source for charged particles such as the one discussed in H.-W. Fink, "Point Source for Ions and Electrons", Physica Scripta, Vol. 38 (1988), pp. 260–263. This point source consists of a tungsten tip which either ends in a cluster of very few tungsten atoms, such as a trimer, for example, or in a single tungsten atom on top of a trimer. With such a tip, the electric field is almost entirely confined at the very end of the tip. Accordingly, the electrons or ions are produced sequentially at a well-defined physical point in space.

It is an object of the present invention to propose a source of charged particles, such as electrons or ions, where the particle beam emitted from the source is narrow and of low energy. This object is achieved with a sharp point acting as the source of charged particles and aligned with a small aperture, and with the distance between point and aperture being controlled within the order of magnitude of the aperture's diameter.

Details of an embodiment of the invention will hereafter be described by way of example having reference to the attached drawings in which.

Figure 1:
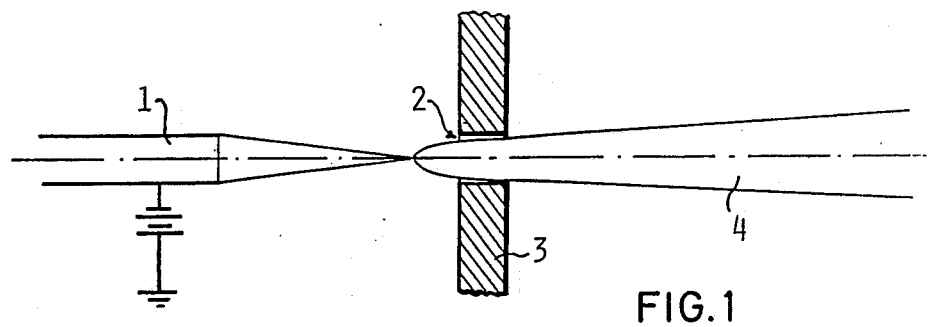
FIG. 1 shows the principle of the arrangement of electron source and aperture.

FIG. 1 shows the arrangement of principal elements making up the particle source of the present invention. A very sharply pointed tip 1 is precisely aligned with an aperture 2 in a thin foil 3. Tip 1 is connected to a potential $V_0$, and foil 3 is connected to a potential $V_1$. With a very small distance maintained between tip 1 and foil 3, a relatively strong electrical field will extract electrons from tip 1 which get accelerated in the direction of aperture 2. Passing aperture 2, the electrons enter, as a beam 4, the field-free space beyond foil 3.

One condition for the electron beam 4 to have a small diameter is the sharpness of the electron source, viz. of tip 1, i.e., the angular divergence of the source should be a minimum. The sharpest tip possible is one that has its apex ending in a single atom. Such a tip, or one having a triplet of atoms at its apex, has a small enough angular divergence, so that the spread of the electron beam at the plane of aperture 2 still is in the submicrometer or even nanometer range.

A straightforward way to build up stable single atom tips is described by H.-W. Fink in "Mono-atomic tips for scanning tunneling microscopy", IBM Journal of Research and Development, Vol. 30, No. 5, 1986, pp. 460–465. In essence, a single tungsten atom is placed by field-ion microscopy techniques onto the very end of a sharply pointed tungsten tip. The end of the tip is represented by a trimer of tungsten atoms on a (111) plane. As mentioned before, also a trimer of atoms at the apex will do.

The emission voltage for a sharply pointed tip typically is a few hundreds of volts. This comparatively low value is further reduced in the environment of the present invention owing to the close proximity of tip 1 to aperture 2. Actually, at the beginning of the alignment cycle, i.e., when the distance between tip 1 and aperture 2 is still in the micrometer range, the potential $V_0$ at tip 1 may have to be as high as 320 volts. During the approach of tip 1 to aperture 2, the potential may be lowered successively to less than 50 volts.

The distance between tip 1 and aperture 2 should be in the submicron range. This distance is very well suited to be controlled with the well-known scanning tunneling microscopy (STM) technology. In connection with the development of the scanning tunneling microscope, several coarse/fine approach devices have been proposed which may also find application in connection with the present invention. Reference is made, for example, to IBM Technical Disclosure Bulletin, Vol. 27, No. 10B, Mar. 1985, pages 5976–5977, which discloses a piezoelectric xyz-drive having three linked legs for positioning an electron-emitting tip in a tunneling environment. With a positioning device like this one, it will be possible to exactly align tip 1 with aperture 2.

Another possibility is the in situ manufacture of a suitable aperture in automatic alignment with the tip. A method for making self-aligned apertures is described in EP-A-...(EP Appln. 88111803.8). The tip is placed in front of a thin metal foil at very short distance in an atmosphere of heavy gas atoms. The application of an elevated voltage at the tip will result in a sputtering operation to commence and erode the metal foil underneath the facing tip. The sputtering operation is preferably continued until the first ions are detected to emerge on the far side of the foil.

Figure 2:
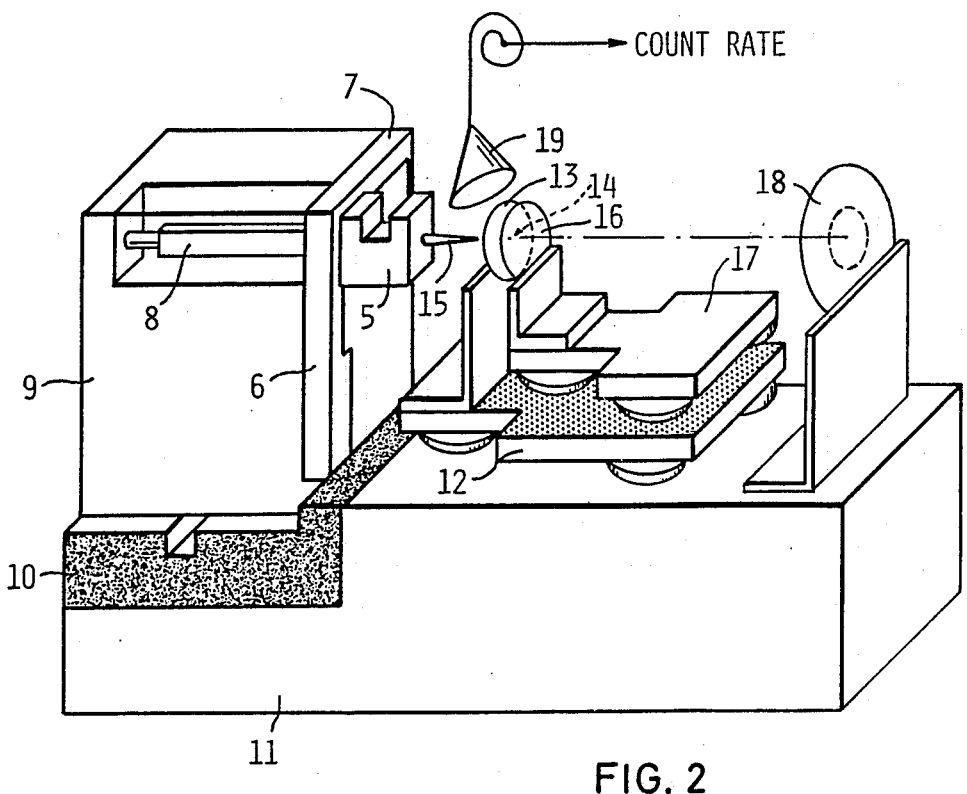
FIG. 2 is a schematic illustration of a microscope setup employing an electron source and an aperture in accordance with the invention.

FIG. 2 shows a setup for imaging surfaces with low-energy electron or ion beams. This setup is similar to a scanning tunneling microscope with an xyz-drive 5 that may, for example, comprise a set of piezoelectric elements 6 through 8 mounted to three orthogonal edges of a cube 9. The latter can slide on a sapphire block 10 which rests in a bench 11. Arranged on a travelling support 12 is a foil 13, with an aperture 14 therein in exact alignment with a tip 15 attached to said xyz-drive 5. The sample 16 is arranged on a separate xyz-drive 17 which permits adjustment of the distance the particle beam is to travel in order to reach the sample, and to provide for xy-scanning the beam across the sample.

Coarse adjustment of the distance between aperture 14 and tip 15 is made by approaching travelling support 12 towards cube 9 under continuous monitoring the electron projection picture of aperture 14 on a channel plate detector 18, in the absence of sample 16. Fine adjustment is then performed by appropriately activating the z-portion of xyz-drive 5. It may be necessary in this operation to displace the aperture in x- or y-direction from alignment with tip 15 in order to arrive at the desired distance between foil 13 and tip 15. When the proper tip/aperture alignment is obtained, the tunneling current then flowing across the gap between foil 13 and tip 15 is maintained constant by means of a conventional feedback loop. With a tip voltage of 15 volts, the tunneling current will be on the order of 0,1 nA.

The setup of FIG. 2 is adapted for the generation of both low-energy electron and ion beams. If placed under ultra-high vacuum, the setup will generate a beam of free electrons by field-emission from tip 15, the beam being narrowed down in diameter when passing aperture 14. The low-energy (e.g., 15 eV) electrons impinging on the sample will produce secondary electrons from the atoms located at the first several molecular layers at the surface. The penetration depth of the electron beam, of course, depends on the material of the sample, besides the energy of the beam. Obviously, with these low-energy electrons, the space underneath the point of impact from which secondary electrons are emitted is smaller by several orders of magnitude than under high-energy (keV) conditions. The secondary electrons can be picked up with a conventional channeltron detector 18.

Scanning tip 15 across the surface of sample 16 by means of the xy-part of xyz-drive 17, and keeping the emission current constant by controlling the tip/sample distance, the signal to be monitored is the count rate obtained from channeltron detector 18. Three features will become apparent immediately:

1. The brightness of the electron source is very high because all of the electrons must leave the tip through the one atom (or trimer) at the apex thereof. At a current of 10 $\mu$A, the current density is extremely high.
2. High-contrast images are obtained; the count rate for the secondary electrons is between $10^2$ and $10^5$ electrons per second.
3. From the features observed, a lateral resolution on the order of 3 nm can be deduced.

An ion beam is generated when the ultra-high vacuum is replaced by a noble gas atmosphere, say helium, at a pressure on the order of $10^{-4}$ mbar, and with a change of polarity of the potential at the tip. Most of the field of 45 V/nm necessary for the ionization of helium is concentrated at the apex of tip 15, thus at the single atom or trimer of atoms, again making the tip a very bright point source. The ionization rate is essentially constant, apart from statistical fluctuations.

In the case of generation of an ion beam, the vacuum requirements are relaxed in comparison to the case of the electron beam since any rest gas atoms exhibit a lower ionization potential than helium and they are, therefore, field-ionized before having a chance of interacting with the chemically reactive tungsten tip.

In one experiment carried out using the setup of the present invention, a tungsten tip with a (111) orientation was placed close to, and aligned with, a hole in a thin carbon foil. From the many holes in the foil, one with a diameter of approximately 1 $\mu$m was selected. During the approach of the tip towards the hole, the potential at the tip of originally 320 volts was reduced to 46 volts, keeping the current constant. The diameter of the electron beam at the plane of the aperture was found to be about 500 nm. Field ionization of helium gas was determined to commence at about 450 volts already, a remarkably low value.

In view of the low voltage required for the electron beam to be generated, the free electrons or ions propagating from the aperture have a correspondingly low kinetic energy, and owing to the small angular divergence of the tip used in their generation, the further focusing at the aperture can occur at a high efficiency.

Having thus described our invention, what we claim as new, and desire to secure by Letters Patent is:

1. Low-voltage source for electron/ion beams, comprising a pointed tip (1, 15) connected to a source of electrical potential, characterized in that said tip (1, 15) is aligned with an aperture (2, 14) in a thin sheet (3, 13), the distance between said tip (1, 15) and said aperture (2, 14) being between 1 and 10 nanometers, the diameter of said aperture (2, 14) being less than 1 micrometer, and the potential at said tip (1, 15) being such that free electrons are spontaneously emitted from said tip (1, 15) and passed through said aperture (2, 14) to form a beam (4) of charged particles on the downstream side of said sheet (3, 13).

2. Low-voltage source in accordance with claim 1, characterized in that said tip (1, 15) ends in a trimer of atoms at its apex.

3. Low-voltage source in accordance with claim 1, characterized in that said tip (1, 15) ends in a single atom placed on a trimer of atoms at its apex.

4. Low-voltage source in accordance with claim 1, characterized in that said aperture (2, 14) is in a thin sheet (3, 13) consisting of a foil of carbon and having a thickness on the order of the diameter of said aperture (2, 14) therein.

5. Low-voltage source in accordance with claim 1, characterized in that said tip (15) is attached to an xyz-drive (5) and aligned with said aperture (14) in said sheet (13) and with a sample (16), said sheet (13) and said sample (16) being individually mounted on travelling supports (12, 17) for adjusting their mutual distances and/or xy-scanning of said beam (4) of charged particles across the surface of said sample (16).

6. Low-voltage source in accordance with claim 1, characterized in that the arrangement encompassing said tip (1, 15), said aperture (2, 14) in said sheet (3, 13) and said sample (16) is enclosed in an ultra-high vacuum environment, such that said particle beam (4) essentially consists of low-energy electrons.

7. Low-voltage source in accordance with claim 1, characterized in that the arrangement encompassing said tip (1, 15), said aperture (2, 14) in said sheet (3, 13), and said sample (16) is enclosed in a vessel containing a noble gas atmosphere, such that said particle beam (4) consists of low-energy noble gas ions.

8. Low-voltage source in accordance with claim 7, characterized in that said noble gas atmosphere has a pressure on the order of $10^{-4}$ mbar.

* * * * *